(12) United States Patent
Toyama

(10) Patent No.: US 6,387,809 B2
(45) Date of Patent: *May 14, 2002

(54) METHOD AND APPARATUS FOR LAPPING OR POLISHING SEMICONDUCTOR SILICON SINGLE CRYSTAL WAFER

(75) Inventor: Kohei Toyama, Fukushima-ken (JP)

(73) Assignee: Shin-Etsu Handotai Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,274

(22) Filed: Mar. 16, 1999

(30) Foreign Application Priority Data

Mar. 23, 1998 (JP) .............................. 10-074358

(51) Int. Cl.[7] .............................. H01L 21/304
(52) U.S. Cl. ..................... 438/691; 438/928; 438/959
(58) Field of Search ................. 438/692, 959, 438/691, 928; 156/345; 451/331, 460

(56) References Cited

U.S. PATENT DOCUMENTS 5,967,882 A * 10/1999 Duescher ..................... 451/57

FOREIGN PATENT DOCUMENTS

| EP | 0 628 992 | 12/1994 |
| JP | 356081934 | * 7/1981 |

* cited by examiner

Primary Examiner—Robert Kunemund
Assistant Examiner—Donald L. Champagne
(74) Attorney, Agent, or Firm—Arent Fox Kintner Plotkin & Kahn, PLLC

(57) ABSTRACT

A method and apparatus for lapping or polishing a semiconductor silicon single crystal wafer is provided for eliminating the transfer of waviness of a wafer cut by a wire saw apparatus, improving the quality of the wafer, realizing automated lapping or polishing processes, allowing for single crystal processing from a cassette to another cassette, and increasing the workability and labor productivity. A small amount "e" of single-side lapping or single-side polishing is repeated alternately on the two sides "A" and "B" of a semiconductor silicon single crystal wafer "W" to get to a predetermined total lapping or polishing stock removal.

2 Claims, 4 Drawing Sheets

METHOD AND APPARATUS FOR LAPPING OR POLISHING SEMICONDUCTOR SILICON SINGLE CRYSTAL WAFER

BACKGROUND OF THE INVENTION

1. Field of the Invention

The present invention relates to a method and apparatus for lapping or polishing semiconductor silicon single crystal wafer which can produce a wafer having a high degree of flatness in a lapping or polishing step of a semiconductor silicon single crystal wafer, particularly, a large diameter semiconductor silicon single crystal wafer.

2. Description of the Related Art

With a lapping apparatus currently in use for lapping semiconductor silicon single crystal wafers, as workpieces (semiconductor silicon single crystal wafers) have larger diameters, they are generally lapped without reducing the number of workpieces simultaneously loaded or processed in order to pursue higher productivity.

As a result, the lapping apparatus have become larger and heavier, as having a weight of 30–40 tons, so that reconsideration must be taken even for the construction of a building for accommodating the lapping apparatus or the like.

As workpieces of larger diameters are used and apparatus of larger sizes are introduced, a longer time is required for loading and unloading the workpieces for lapping. In view of true working efficiency, the influence of the time required for such operations cannot be ignored.

In considering automated loading operations and so on, difficulties are encountered in loading a plurality of wafers on each of a plurality of carriers, so that a problem arises in bringing the automation into practice.

From a view point of a reduction in weight of apparatus and automation with an introduction of single wafer processing, grinding with a bonded abrasive has been considered as an alternative to lapping but not yet introduced into mass production processes.

The processing of a semiconductor silicon single crystal wafer is basically proceeded in a sequence of slicing, lapping, etching, polishing and cleaning steps.

As workpieces (semiconductor silicon single crystal wafers) have larger diameters, the production scheme has also been changed in form. Specifically, for the slicing, an inner diameter saw has been replaced with a wire saw apparatus.

A wafer cut by a wire saw apparatus, however, exhibits a large deformation called "undulations (waviness)" (cross-sectional shape of the wafer) due to the characteristics of the wire saw apparatus, largely affecting the quality of final mirror-polished wafer (sori, bow, flatness and so on).

Generally, for applying the grinding, a vacuum chuck made of ceramics or porous metal, stainless steel or the like is used to chuck a wafer cut by a wire saw apparatus, and the wafer is ground or lapped without a break to a predetermined total grinding or lapping stock removal such as about 50 $\mu$m or more for a single side and about 100 $\mu$m or more for double sides. However, from the relationship between the hardness of a chucking surface and waviness of the wafer, the transferred waviness remains in the ground or lapped wafer, which is a problem.

The polishing also implies similar problems to those of the lapping as mentioned above. In the polishing, a wafer is polished without a break to a predetermined total polishing stock removal, for example, about 10 $\mu$m for a single side and about 20 $\mu$m for double sides. Again, the transferred waviness remains in the polished wafer, resulting in a problem as is the case of the lapping.

OBJECT AND SUMMARY OF THE INVENTION

The present invention has been made in view of the above-mentioned problem inherent to the prior art, and it is an object of the present invention to provide a method and apparatus for lapping or polishing a semiconductor silicon single crystal wafer which can eliminate the transfer of waviness of a wafer cut by a wire saw apparatus, improve the quality of the wafer, realize automated lapping or polishing processes, allow for single wafer processing from a cassette to another cassette, and increase the workability and labor productivity.

To achieve the above object, a method for lapping a semiconductor silicon single crystal wafer according to the present invention is characterized in that a small amount of single-side lapping is repeated alternately on the two surfaces of a semiconductor silicon single crystal wafer to get to a predetermined total lapping stock removal. The stock removal of the small amount of single-side lapping is preferably in a range of 10 to 20 $\mu$m.

The lapping method according to the present invention involves chucking a wafer on a vacuum chuck, lapping one surface of the wafer in a range of 10–20 $\mu$m, inverting the wafer to lap the other surface thereof in a range of 10–20 $\mu$m, and repetitively lapping the two surfaces alternately in a range of 10–20 $\mu$m to get to a predetermined total lapping stock removal, for example, 50 $\mu$m for one side and 100 $\mu$m for double sides.

In the lapping method for the present invention, a small amount of single-side lapping is repeated alternately on the two surfaces of the wafer to get to a predetermined lapping stock removal so that the formation of a reference surface is consequently divided by alternately repeating the single-side lapping. As a result, the transfer of waviness of a wafer caused by a wire saw apparatus, occurring when a predetermined stock removal of lapping is performed without a break, can be alleviated.

A method for polishing a semiconductor silicon single crystal wafer according to the present invention is characterized in that a small amount of single-side polishing is repeated alternately on the two surfaces of a semiconductor silicon single crystal wafer to get to a predetermined polishing stock removal. The stock removal of the small amount of single-side polishing is preferably in a range of 1 to 3 $\mu$m.

The polishing method according to the present invention involves holding a wafer on a vacuum chuck, polishing one surface of the wafer in a range of 1–3 $\mu$m, inverting the wafer to polish the other surface thereof in a range of 1–3 $\mu$m, and repetitively polishing alternately the two surfaces in a range of 1–3 $\mu$m to get to a predetermined total polishing stock removal, for example, 10 $\mu$m for one side and 20 $\mu$m for double sides.

In the polishing method for the present invention, a small amount of single-side polishing is repeated alternately on the two surfaces of a wafer to get to a predetermined total polishing stock removal so that the formation of a reference surface is consequently divided by alternately repeating the single-side polishing. As a result, the transfer of waviness of a wafer caused by a wire saw apparatus, occurring when a predetermined stock removal of polishing is performed without a break, can be alleviated.

An apparatus for lapping or polishing a semiconductor silicon single crystal wafer comprises a wafer chuck for holding a semiconductor silicon single crystal wafer, and a lapping table or a polishing table for lapping or polishing one surface of the semiconductor silicon single crystal wafer held by the wafer chuck.

A wafer inverting device may be provided near the wafer chuck for inverting a semiconductor silicon single crystal wafer, so that the wafer can be readily inverted.

As described above, the present invention can produce effects such as eliminating the transfer of waviness of a wafer cut by a wire saw apparatus, improving the quality of the wafer, realizing automated lapping or polishing, allowing for single wafer processing from a cassette to another cassette, and increasing the workability and labor productivity.

DESCRIPTION OF THE PREFERRED EMBODIMENTS

The present invention will hereinafter be described in conjunction with the preferred embodiments thereof with reference to the accompanying drawings.

Figure 1:
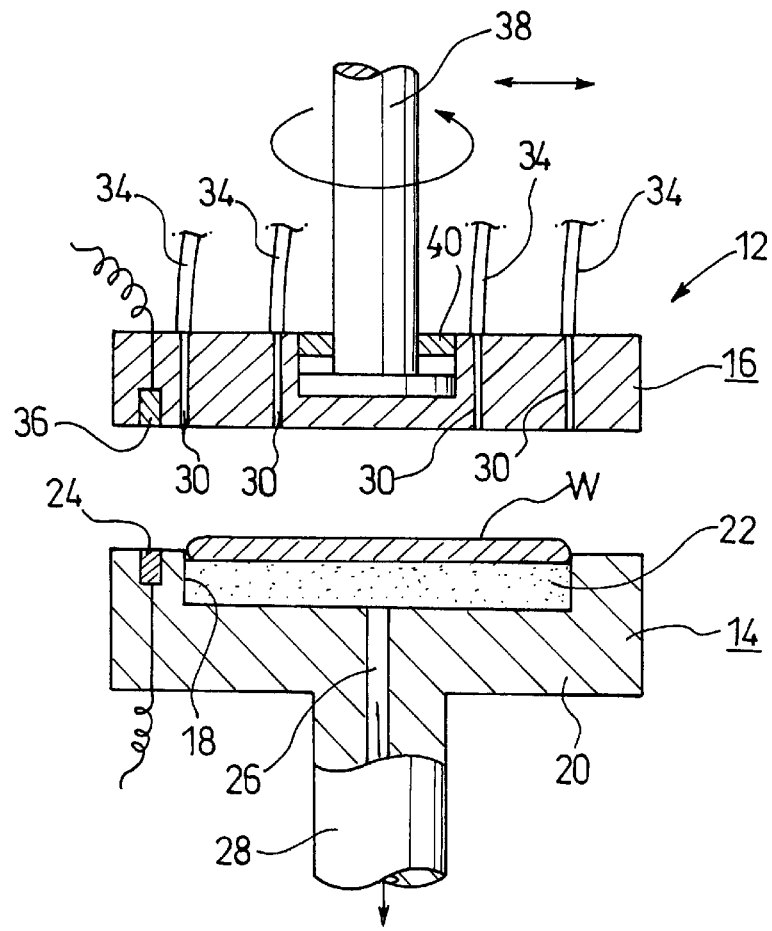
FIG. 1 is a partially cross-sectional explanatory diagram schematically illustrating a lapping apparatus body (or a polishing apparatus body) according to the present invention.

Referring first to FIG. 1, a lapping apparatus body according to the present invention is generally designated by reference numeral 12. The lapping apparatus body 12 includes a wafer chuck 14 for holding a wafer W; and a grooved upper lapping table 16 positioned opposite to and above the wafer chuck 14.

Figure 3:
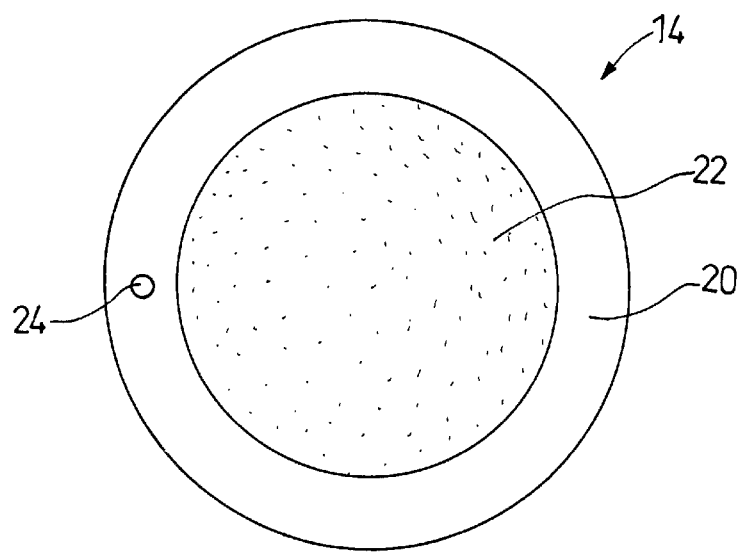
FIG. 3 is a top plan view illustrating a chucking surface of a chuck table in the lapping apparatus body (or the polishing apparatus body) of FIG. 1.

The wafer chuck 14 is composed of a chuck table 20 formed with a receiving recess 18 in a central portion of the top surface, and a porous chuck plate 22 inserted in the receiving recess 18 (see FIG. 3). A lower distance (gap) sensor 24 is disposed in the top surface of a peripheral portion of the chuck table 20.

Figure 2:
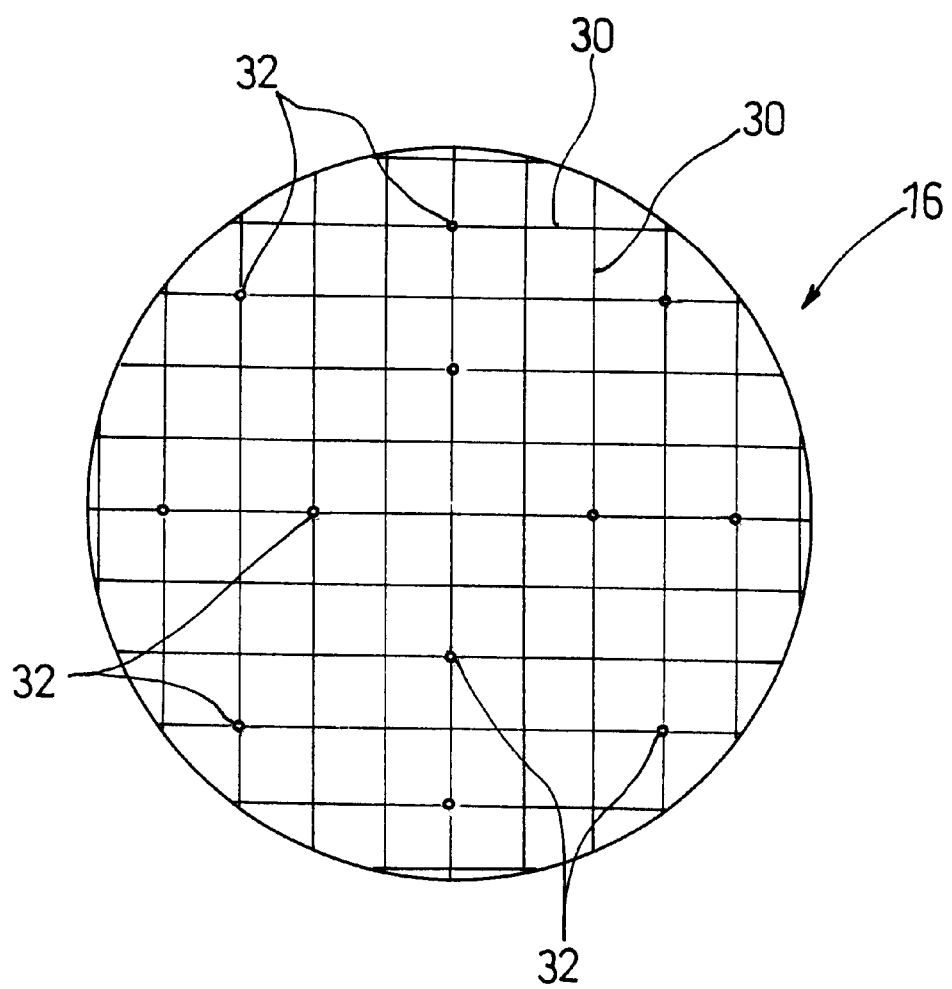
FIG. 2 is a top plan view of an upper lapping (polishing) table of the lapping apparatus body (or the polishing apparatus body) illustrated in FIG. 1.

The chuck table 20 is formed with a vacuum suction port 26 which extends through a central portion thereof. A lower rotating shaft 28 extends downwardly from a central portion of the bottom surface of the chuck table 20. The grooved upper lapping table 16 is formed with grooves 30 in a grid form on the bottom surface thereof (see FIG. 2). The proper number of slurry supply ports 32 is formed at intersections of the grooves 30.

Reference numeral 34 designates a slurry supply pipe which supplies the slurry supply port 32 with a slurry. An upper distance (gap) sensor 36 is disposed in the bottom surface of a peripheral portion of the grooved upper lapping table 16 corresponding to the lower distance sensor 24.

An upper rotating shaft 38 is implanted on a central portion of the top surface of the grooved upper lapping table 16. A stopper 40 is provided for fixing the upper rotating shaft 38.

In the present invention, the lapping apparatus body 12 as mentioned above is used to repeat a small amount of single-side lapping alternately on the two surfaces of the wafer W. In the following, a lapping apparatus 10, which is a combination of the lapping apparatus body 12 and a wafer inverting mechanism, will be described with reference to FIG. 4.

Figure 4:
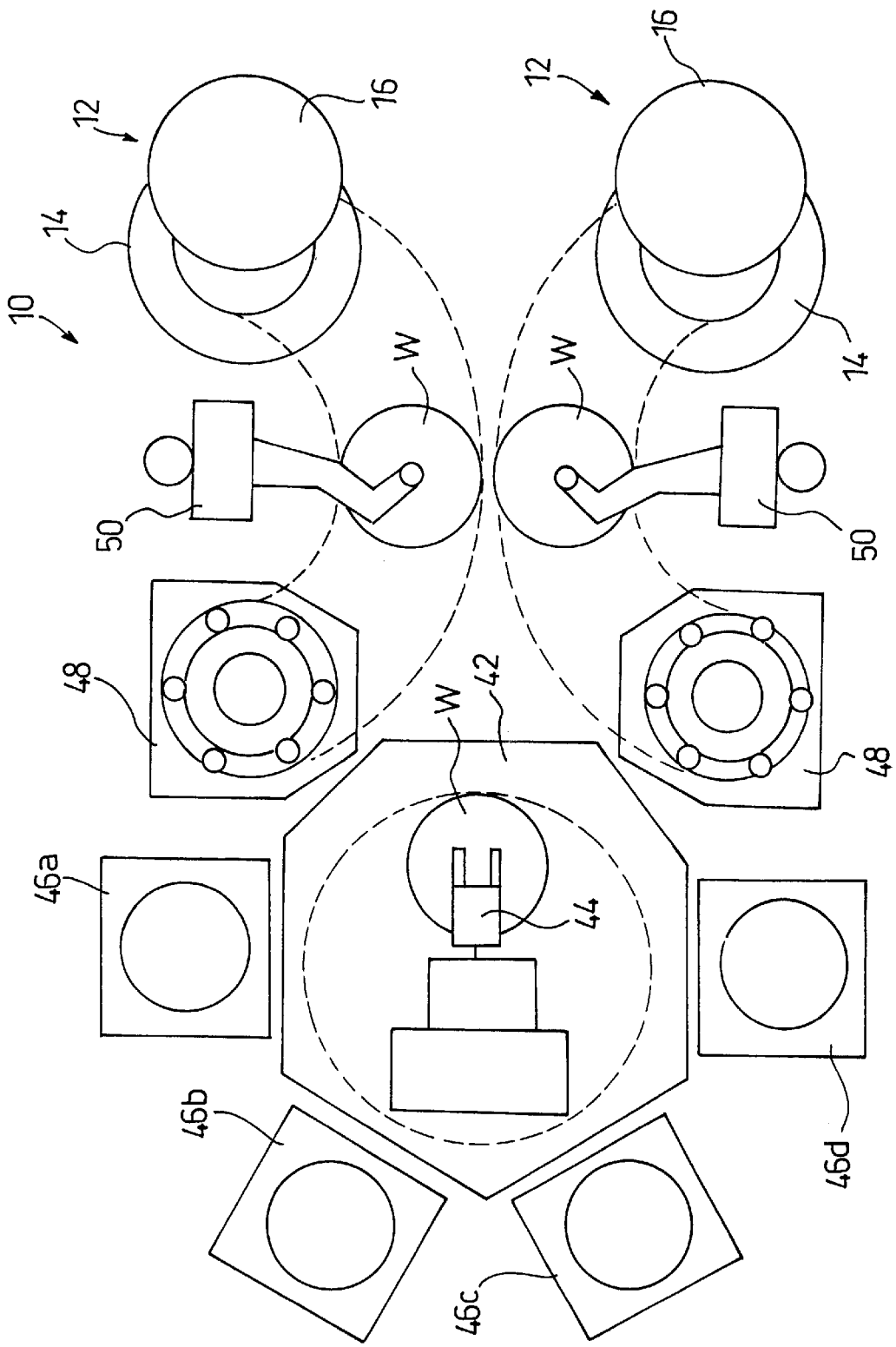
FIG. 4 is a plan explanatory view generally illustrating the whole arrangement of the lapping apparatus (or the polishing apparatus) according to the present invention.

Referring specifically to FIG. 4, the lapping apparatus 10 is equipped with a wafer inverting device 42. The wafer inverting device 42 has a robot hand 44. By manipulating the robot hand 44, wafers W accommodated in cassettes 46a, 46b, 46c, 46d disposed around the wafer inverting device 42 can be taken therefrom and inverted.

A pair of wafer centering devices 48 are disposed adjacent to the wafer inverting device 42. Wafers W taken from the cassettes 46a–46d are transported to and carried on the wafer centering devices 48 through the wafer inverting device 42.

Transfer arms 50 are disposed adjacent to the respective wafer centering devices 48. Each of the transfer arms 50 chucks the wafer W carried on the corresponding wafer centering device 48, and places the chucked wafer W on the wafer chuck 14 of the lapping apparatus body 12 similarly disposed nearby.

A wafer W which has one side single-side lapped by the lapping apparatus body 12 is inverted by the action of the transfer arm 50, the wafer centering device 48 and the wafer inverting device 42. The inverted wafer W is placed on the top surface of the wafer chuck 14 of the lapping apparatus body 12 by the wafer centering device 48 and the transfer arm 50, and the other side of the wafer W is single-side lapped.

According to the lapping apparatus 10 of the present invention as described above, the alternate one-side lapping on the two surfaces of the wafer W can be readily performed. The lapping method according to the present invention will be described in greater detail with reference to the cross-sectional views of FIGS. 5(a)–5(g).

Figure 5:
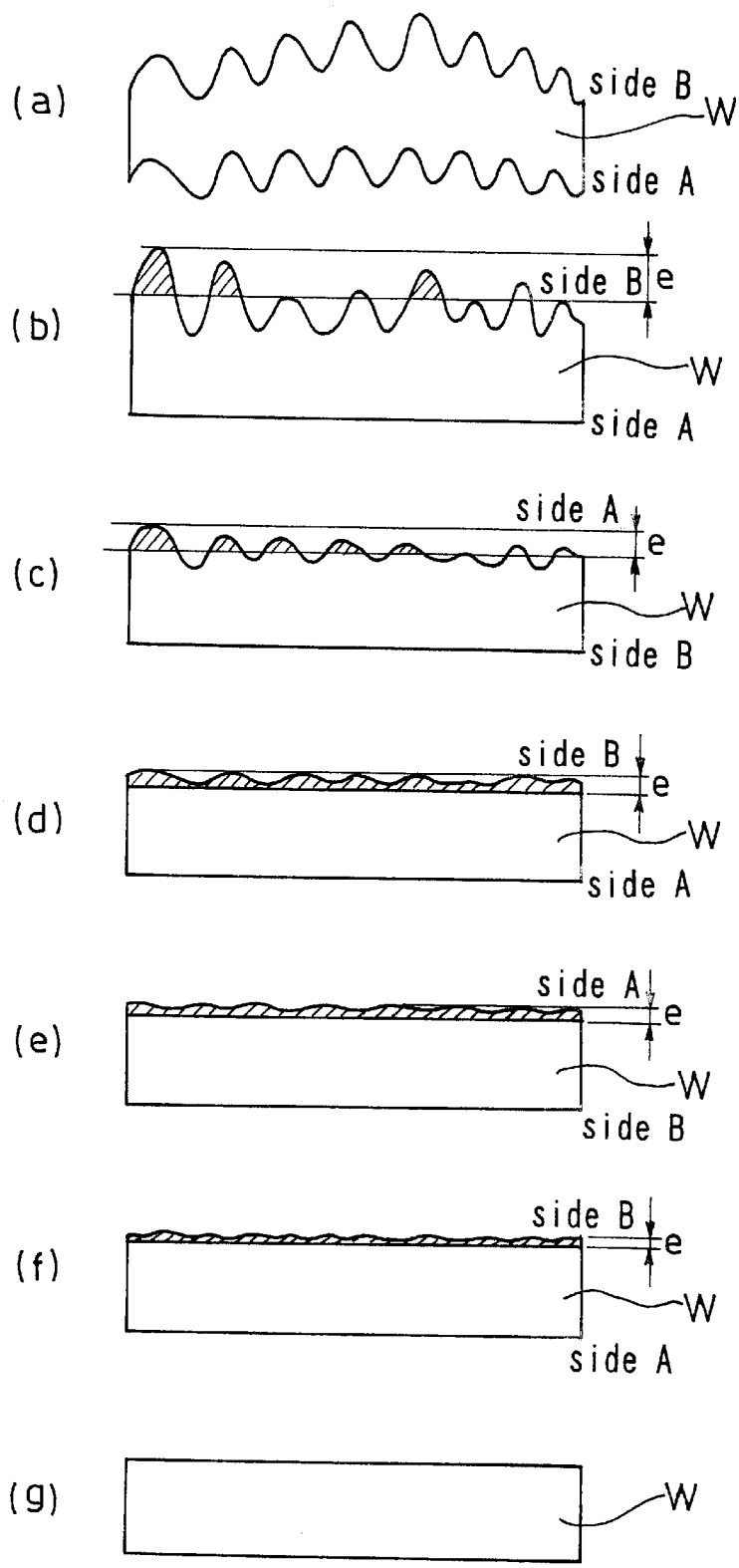
FIG. 5 parts (a) to (g) are cross-sectional views showing a sequence of steps in a lapping method (or a polishing method) according to the present invention.

FIG. 5(a) illustrates a waved cross-sectional shape of a wafer W cut by a wire saw apparatus. First, a side A of the wafer W is chucked on the wafer chuck 14 of the lapping apparatus body 12, and the opposite side (side B) is lapped by a small lapping stock removal $\underline{e}$, for example, in a range of 10 to 20 $\mu$m with reference to the chucking surface (FIG. 5(b)).

Next, the wafer W is inverted, and the lapped side B is chucked by the wafer chuck 14, and the opposite side (side A) is lapped by the small lapping stock removal $\underline{e}$, for example, in a range of 10 to 20 $\mu$m. In this state, the side A chucked in FIG. 5(b) presents smaller waviness as illustrated in FIG. 5(c).

Subsequently, the wafer W is again inverted, and the side B is lapped by the small lapping stock removal $\underline{e}$, for example, in a range of 10 to 20 $\mu$m (FIG. 5(d)). In the following, the inversion of the wafer W and the single-side lapping are repeated. As the waviness is gradually reduced, the lapping stock removal $\underline{e}$ may also be reduced (FIGS. 5(e) and 5(f)).

By thus repeating the single-side lapping, the wafer W is lapped to a predetermined total lapping stock removal (100 $\mu$m or more), and the resulting wafer W after the completion of lapping is free from waviness and thus has flat surfaces in its finished shape (FIG. 5(g)).

Thus repeating a small amount of lapping alternately on the top and bottom surfaces of a wafer until a predetermined total lapping stock removal is completed, leads to a large contribution in eliminating the transfer of waviness of a wafer cut by a wire saw apparatus, thereby improving the quality of the wafer.

Operations involved in the lapping method according to the present invention can be automatically performed, in which case means for detecting that lapping has been performed by the predetermined small lapping stock removal $\underline{e}$ (for example, 10–20 μm) must be set near the lapping apparatus body 12.

The automatic lapping apparatus carries a wafer from a cassette to the lapping apparatus body, and starts lapping the wafer. When the detecting means comprising upper and lower distance sensors 36, 24 detects that the wafer has been lapped by the predetermined small lapping stock removal $\underline{e}$ and generates a signal indicative of the detection, the lapping is stopped in response to the detection signal. Then, the wafer is inverted, and the opposite side is lapped. This operation is repeated to finally lap the wafer to a predetermined total lapping stock removal (100 μm or more), and then the wafer is accommodated in the cassette.

The employment of the single-side lapping can realize automation which has been difficult with double-side lapping. In addition, single wafer processing from a cassette to another cassette can be performed, thereby making it possible to improve the workability and labor productivity.

While the lapping apparatus according to the present invention includes a function for adjusting the temperature of the upper lapping table 16 by controlling flow rate and/or temperature of cooling water supplied to the upper lapping turn table by a cooling water supplying unit. The lapping apparatus also includes a function for adjusting an over-lap amount for the upper lapping table 16 to the wafer chuck 14 by moving the upper lapping table 16 back and forth in swinging manner by a motor or the like. The lapping apparatus further includes a load adjusting function of upper lapping table 16 and so on for adjusting a lapping speed by changing weight applied to upper lapping table or by changing pressure of air, water, oil and the like used for applying a load to upper lapping table 16.

A polishing apparatus according to the present invention has a similar construction to the lapping apparatus 10 according to the present invention except that a soft or viscoelastic polishing pad is attached on a polishing table, so that repetitive explanation of the polishing apparatus with reference to drawings is omitted. According to the polishing apparatus of the present invention, single-side polishing can be readily accomplished alternately on the two sides of a wafer W. A polishing method according to the present invention is proceeded in a manner similar to the steps of the lapping method according to the present invention illustrated in FIGS. 5(a)–5(g), except that the polishing method uses a mixture of polishing abrasive grains made of finer particles such as colloidal silica than lapping abrasive grains such as alumina and a processing liquid. Therefore, the polishing method will be described in brief with reference to the same FIGS. 5(a)–5(g).

First, a side A of a wafer W is chucked on the wafer chuck 14 of the polishing apparatus, and the opposite side (side B) is polished by a small polishing stock removal $\underline{e}$, for example, in a range of 1 to 3 μm with reference to the chucking surface (FIG. 5(b)).

Next, the wafer W is inverted, and the polished side B is chucked by the wafer chuck 14, and the opposite side (side A) is polished by the small polishing stock removal $\underline{e}$, for example, in a range of 1 to 3 μm. In this state, the side A chucked in FIG. 5(b) presents smaller waviness as illustrated in FIG. 5(c).

Subsequently, the wafer W is again inverted, and the side B is polished by the small polishing stock removal $\underline{e}$, for example, in a range of 1 to 3 μm (FIG. 5(d)). In the following, the inversion of the wafer W and the single-side polishing are repeated. As the waviness is gradually reduced, the polishing stock removal $\underline{e}$ may also be reduced (FIGS. 5(e) and 5(f)).

By thus repeating the single-side polishing, the wafer W is polished to a predetermined total polishing stock removal (approximately 20 μm), and the resulting wafer W after the completion of polishing is free from waviness and thus has flat surfaces in its finished shape (FIG. 5(g)).

Thus repeating a small amount of polishing alternately on the top and bottom surfaces of a wafer until a predetermined polishing stock removal is completed, leads to a large contribution in eliminating the transfer of waviness of a wafer cut by a wire saw apparatus, thereby improving the quality of the wafer.

Operations involved in the polishing method according to the present invention can also be automatically performed, in which case means for detecting that polishing has been performed by the predetermined small polishing stock removal $\underline{e}$ (for example, 1–3 μm) must be set near the polishing apparatus body.

The automatic polishing apparatus carries a wafer from a cassette to the polishing apparatus body, and starts polishing the wafer. When the detecting means comprising upper and lower distance sensors detects that the wafer has been polished by the predetermined small polishing stock removal $\underline{e}$ and generates a signal indicative of the detection, the polishing is stopped in response to the detection signal. Then, the wafer is inverted, and the opposite side is polished. This operation is repeated to finally polish the wafer to a predetermined total polishing stock removal (approximately 20 μm), and then the wafer is accommodated in the cassette.

The employment of the single-side polishing can realize automation which has been difficult with double-side polishing. In addition, single wafer processing from a cassette to another can be performed, thereby making it possible to improve the workability and labor productivity.

While the polishing apparatus according to the present invention includes a function for adjusting the temperature of the upper polishing table 16 by controlling flow rate and/or temperature of cooling water supplied to the upper polishing turn table by a cooling water supplying unit. The polishing apparatus also includes a function for adjusting an over-polish amount of the upper polishing table 16 to the wafer chuck 14 by moving the upper polishing table 16 back and forth in swinging manner by a motor or the like. The polishing apparatus further includes a load adjusting function of upper polishing table 16 and so on for adjusting a polishing speed by changing weight applied to upper polishing table or by changing pressure of air, water, oil and like used for applying a load to upper polishing table 16.

Obviously, various minor changes and modifications of the present invention are possible in the light of the above teaching. It is therefore to be understood that within the scope of appended claims the invention may be practiced otherwise than as specifically described.

What is claimed is:

1. A method of lapping a semiconductor silicon single crystal wafer to form a reference surface, wherein a small amount of single-side lapping in a range of from 10 to 20 µm is repeated and divided alternately between opposite surfaces of a semiconductor silicon single crystal wafer until obtaining a total amount of lapping stock removal and until the wafer is free from waviness.

2. A method of polishing a semiconductor silicon single crystal wafer to form a reference surface, wherein a small amount of single-side polishing in a range of from 1 to 3 µm is repeated and divided alternately between opposite surfaces of a semiconductor silicon single crystal wafer until obtaining a total amount of polishing stock removal and until the wafer is free from waviness.

* * * * *